(12) United States Patent
Cui et al.

(10) Patent No.: US 9,786,808 B2
(45) Date of Patent: Oct. 10, 2017

(54) METHOD OF ANODISING A SURFACE OF A SEMICONDUCTOR DEVICE

(71) Applicant: NEWSOUTH INNOVATIONS PTY LIMITED, Sydney (AU)

(72) Inventors: Jie Cui, Rosebury (AU); Xi Wang, Kingsford (AU)

(73) Assignee: NEWSOUTH INNOVATIONS PTY LIMITED, Sydney (AU)

(*) Notice: Subject to any disclaimer, the term of this patent is extended or adjusted under 35 U.S.C. 154(b) by 0 days.

(21) Appl. No.: 14/780,047

(22) PCT Filed: Mar. 24, 2014

(86) PCT No.: PCT/AU2014/000307
§ 371 (c)(1),
(2) Date: Sep. 25, 2015

(87) PCT Pub. No.: WO2014/153597
PCT Pub. Date: Oct. 2, 2014

(65) Prior Publication Data
US 2016/0064592 A1 Mar. 3, 2016

(30) Foreign Application Priority Data
Mar. 25, 2013 (AU) .............................. 2013901031

(51) Int. Cl.
*H01L 31/00* (2006.01)
*H01L 31/18* (2006.01)
(Continued)

(52) U.S. Cl.
CPC ........ *H01L 31/1868* (2013.01); *C25D 11/005* (2013.01); *C25D 11/022* (2013.01); *C25D 11/06* (2013.01); *C25D 11/32* (2013.01); *C25D 17/06* (2013.01); *H01L 31/0236* (2013.01); *H01L 31/02167* (2013.01); *H01L 31/022425* (2013.01); *Y02E 10/50* (2013.01); *Y02P 70/521* (2015.11)

(58) Field of Classification Search
CPC .................................................. H01L 31/1868
USPC ............................................................ 136/256
See application file for complete search history.

(56) References Cited

U.S. PATENT DOCUMENTS 2,694,040 A 11/1954 Davis et al.

FOREIGN PATENT DOCUMENTS

| EP | 2565299 A1 | 3/2013 |
|----|------------|--------|
| GB | 1058689 A | 2/1967 |

OTHER PUBLICATIONS

Yoshida, T. et al., "Photo-Induced Preferential Anodization for Fabrication of Monocrystalline Micromechanical Structures", Micro Electro Mechanical Systems (1992) (pp. 56-61).

(Continued)

*Primary Examiner* — Shannon Gardner
(74) *Attorney, Agent, or Firm* — Ballard Spahr LLP

(57) ABSTRACT

The present disclosure provides a method of anodizing a surface of a semiconductor device comprising a p-n junction. The method comprises exposing a first surface portion of the semiconductor device to an electrolytic solution that is suitable for anodizing the first surface portion when an electrical current is directed through a region at the first surface portion. Further, the method comprises exposing a portion of the semiconductor device to electromagnetic radiation in a manner such that the electromagnetic radiation induces the electrical current and the first surface portion anodizes.

9 Claims, 17 Drawing Sheets

(51) Int. Cl.
*H01L 31/0216* (2014.01)
*H01L 31/0224* (2006.01)
*C25D 11/32* (2006.01)
*C25D 11/02* (2006.01)
*C25D 11/06* (2006.01)
*C25D 17/06* (2006.01)
*H01L 31/0236* (2006.01)
*C25D 11/00* (2006.01)

(56) References Cited

OTHER PUBLICATIONS

International Search Report issued by the International Searching Authority on May 20, 2014 for international application PCT/AU2014/000307, filed on Mar. 24, 2014 and published as WO 2014153597 on Oct. 2, 2014 (Applicant—NewSouth Innovations Pty Ltd. // Inventor—Cui, et al.) (4 pages).

Written Opinion issued by the International Searching Authority on May 20, 2014 for international application PCT/AU2014/000307, filed on Mar. 24, 2014 and published as WO 2014153597 on Oct. 2, 2014 (Applicant—NewSouth Innovations Pty Ltd. // Inventor—Cui, et al.) (5 pages).

International Preliminary Report on Patentability issued by the International Searching Authority on Sep. 29, 2015 for international application PCT/AU2014/000307, filed on Mar. 24, 2014 and published as WO 2014153597 on Oct. 2, 2014 (Applicant—NewSouth Innovations Pty Ltd. // Inventor—Cui, et al.) (6 pages).

METHOD OF ANODISING A SURFACE OF A SEMICONDUCTOR DEVICE

CROSS REFERENCE TO RELATED APPLICATIONS

This application is a national phase filing of International patent application No. PCT/AU2014/000307, filed Mar. 24, 2014, which claims priority to Australian patent application No. 2013901031, filed on Mar. 25, 2013, both of which are herein incorporated by reference in their entireties.

TECHNICAL FIELD OF THE INVENTION

The present invention relates generally to the field of semiconductor device fabrication and, in particular, to a method of anodising a surface of a semiconductor device.

BACKGROUND OF THE INVENTION

Silicon solar cells require effective surface passivation to ensure high operating voltages and therefore high energy conversion efficiencies. Surface passivation is usually achieved by depositing or thermally growing a dielectric layer which can either reduce the density of defect states at the surface or largely repel electrical carriers of one polarity from the surface to decrease the probability of carrier recombination at the semiconductor surface.

Thermally-grown layers of silicon dioxide and silicon nitride, the latter deposited by plasma enhanced chemical vapour deposition (PECVD), are commonly-used in solar cell manufacturing as passivation dielectrics. These layers can improve the surface passivation of n-type silicon by storing positive charges, which induce accumulation layers of majority carrier electrons at the semiconductor surface.

Similarly, aluminium oxide layers which can be deposited using either PECVD or atomic layer deposition (ALD), can contain stored negative charges which can effectively passivate p-type silicon surfaces by inducing an accumulation layer of majority carriers.

However, the deposition processes of the abovementioned dielectrics generally require high temperature furnaces or vacuum chambers, which involve a nigh thermal budget and/or long processing periods. Further, chemical and physical vapour deposition processes usually consume source materials that can be hazardous, are expensive and/or toxic and consequently may create environmental problems.

Dielectric layers can be formed on silicon surfaces by anodisation of metal precursor layers in a solution-based electrochemical reaction. The anodisation process has advantages over thermal growth and chemical or physical deposition processes. Typically, the reaction takes place in an electrolytic solution using inexpensive chemicals at room temperature and under atmospheric pressure. Furthermore, the electrochemical bath can be maintained in such a way as to support an inline process with controlled dosing and bleeding of electrolyte to ensure electrolyte stability with time. Quality passivation, however, requires uniform and complete anodisation of the surface layer. Unfortunately, the majority of previously proposed methods for anodising surface layers on semiconductor wafer require the application of a voltage to the layer being anodised whilst the wafer is immersed in an electrolytic solution. This voltage is typically applied using a conductive clip. The voltage is applied to generate an electric field horizontally across the wafer and a lateral current flow through the layer to be anodised. The lateral current can result in a non-uniform anodisation and non-optimal passivation of the device surface. Furthermore, the resistance to the lateral current flow increases with the thickness of the anodised layer, decreasing the anodisation current and increasing processing time.

SUMMARY OF THE INVENTION

In accordance with a first aspect, the present invention provides a method of anodising a surface of a semiconductor device comprising a p-n junction, the method comprising the steps of:
exposing a first surface portion of the semiconductor device to an electrolytic solution that is suitable for anodising the first surface portion when an electrical current is directed through a region of the semiconductor device at the first surface portion; and
exposing a portion of the semiconductor device to electromagnetic radiation in a manner such that the electromagnetic radiation induces the electrical current and the first surface portion anodises.

In one embodiment the step of exposing a portion of the semiconductor device to electromagnetic radiation comprises exposing a second surface portion to the electromagnetic radiation, the second surface portion being a surface portion that is different to the first surface portion. For example, the first and second surface portion may be at opposite sides of the semiconductor device.

The method may further comprise the step of applying a biasing voltage to generate a biasing electrical current to supplement the electrical current that is induced by the electromagnetic radiation. The semiconductor device may comprise an electrode element and the method may comprise applying the biasing voltage via the electrode element. The electrode element may be semi-transparent or substantially transparent to the electromagnetic radiation. The electrode element may comprise at least one of: a conductive oxide, a conductive polymer and graphite.

Embodiments of the method further comprise the step of selecting a property of the electrolytic solution to influence a property of the first surface portion after anodising.

The method may also comprise the step of selecting the biasing voltage to influence a property of the first surface portion after anodizing.

In another embodiment, the method comprises the step of patterning the first surface portion after anodising to influence a property of the first surface portion after anodising. The step of patterning may comprise chemical etching or inkjet printing. The property of the anodised first surface portion may relate to a diameter or a spacing of pores formed in the anodised first surface portion.

In some embodiments of the invention the first surface portion comprises a p-type region of the p-n junction or a surface layer deposited on a p-type surface portion of the semiconductor device.

The method may be conducted such that the radiation-induced current flows transversally to the first surface portion of the semiconductor device.

The electrolytic solution may be one or a combination of: sulphuric acid, phosphoric acid, oxalic acid, boric acid and nitric acid.

The semiconductor device may be arranged to form a solar cell, such as a silicon solar cell.

In accordance with a second aspect, the present invention provides an apparatus for anodising a semiconductor device comprising a p-n junction, the semiconductor device having a first side portion and a second side portion, the apparatus comprising:

a radiation source arranged to illuminate the second side portion of the semiconductor device;

a container for containing an electrolytic solution;

a cathode element positioned for contacting the electrolytic solution; and a support arranged to support the semiconductor device such that in use the first side portion of the semiconductor device is exposed to the electrolytic solution when the container is charged with the electrolytic solution and the second side region is illuminated by radiation from the radiation source in a manner such that a radiation-induced current is generated to anodise the second side portion.

The apparatus may further comprise a voltage source arranged to apply a biasing voltage between the second side region of the semiconductor device and the cathode element.

In accordance with a third aspect, the present invention provides a solar cell device comprising an anodised dielectric layer formed by the method in accordance with the first aspect.

The anodised dielectric layer may be an oxide layer that may be porous. Further, the anodised dielectric layer may be a surface layer and may comprise aluminium or titanium. Additionally or alternatively, the anodised dielectric layer may be patterned. The anodised dielectric layer may be patterned such that the anodised dielectric layer comprises pits with a diameter between 50 and 200 micrometers.

In embodiments of the invention the first surface portion comprises a surface layer that comprises aluminium and/or titanium. The first surface portion may be a surface portion of a p-type region of the p-n junction or a may be a surface portion of a layer deposited on a p-type surface portion of the semiconductor device. Alternatively, the first surface portion may be a surface portion of an re-type region of the p-n junction or may be a surface portion of a layer deposited on an n-type region of the semiconductor device.

In accordance with a second aspect, the present invention provides a method of anodising a dielectric layer of a solar cell device comprising use of the apparatus of the second aspect of the present invention.

In specific embodiments the solar cell comprises silicon.

BRIEF DESCRIPTION OF THE DRAWINGS

The embodiments of the invention will now be described, by way of example, with reference to the accompanying drawings in which.

DETAILED DESCRIPTION OF EMBODIMENTS

Figure 1:
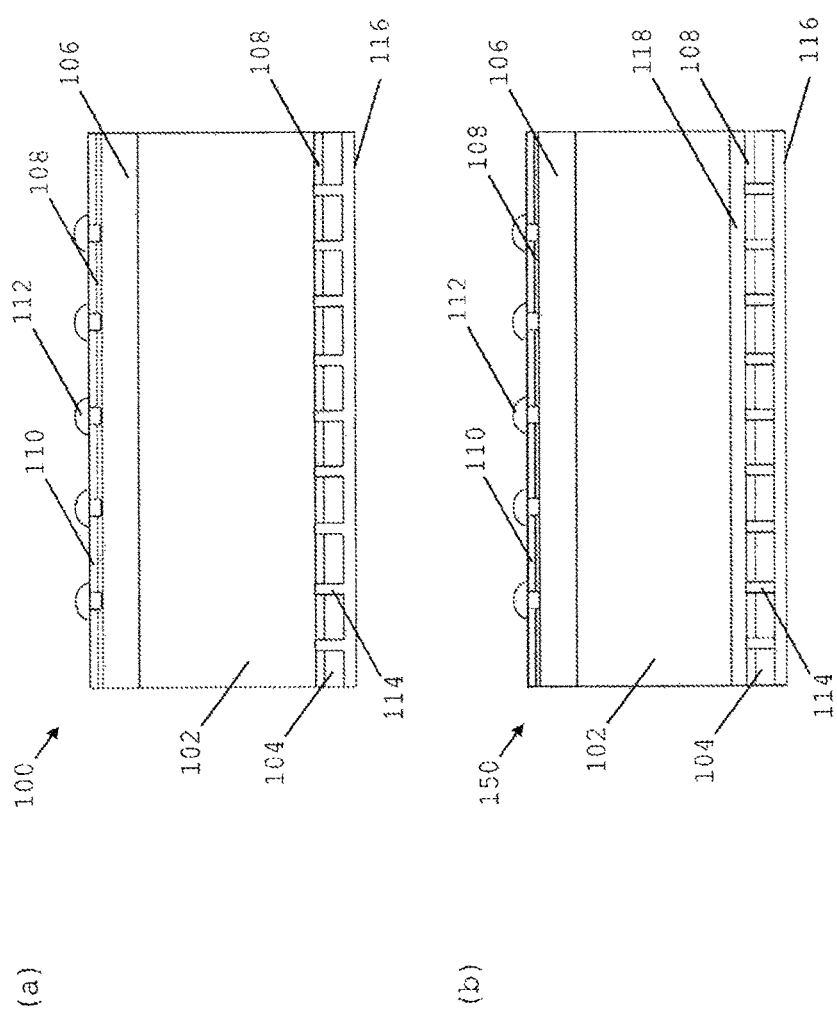
FIG. 1 is a schematic illustration of solar cell devices that have anodised layers.

Embodiments of the present invention relate to a method and an apparatus for anodising a surface layer of a semiconductor device comprising a p-n junction, such as a solar cell. The surface of the semiconductor device being anodised is in contact with an electrolytic solution containing oxygen. The anodisation is realised by illuminating a region of the semiconductor device and thus inducing a current in the device which circulates in the electrochemical circuit constituted by the device, the electrolytic solution, a cathode exposed to the electrolytic solution, and an anode which is in electrical contact with a region of the semiconductor device. The radiation-induced current forward biases the semiconductor device generating a source of electrons at the n-type surface and a source of holes at the p-typo surface of the device. Embodiments of the method can be used to anodise a p-type surface of the semiconductor device to form, for example, a silicon dioxide layer or a dielectric layer comprising elements other than those of the semiconductor device.

Unlike other methods of anodising, which require a direct electrical contact to the material being anodised, the method and apparatus disclosed herein do not require that the surface to be anodised is directly contacted. In addition, the anodisation current is not required to flow laterally through the surface layer to be anodised. Instead the radiation-induced current of the semiconductor device directs the current perpendicular to the surface therefore enabling uniform anodisation.

Referring now to FIG. 1(a), there is shown a silicon solar cell 100 formed on a p-type wafer 102 with an anodised layer 104 formed as rear surface dielectric layer. The solar cell 100 has an n-type emitter layer 106 formed by way of phosphorus diffusion or ion implantation, which forms a p-n junction with the p-type wafer 102. A silicon dioxide layer 103, which typically has a thickness between 5 nm and 20 nm, is formed on both n-type and p-type surfaces of the device to minimise the semiconductor defects at the surface and thus reduce recombination. A dielectric layer, such as silicon nitride or silicon oxy-nitride 110, which typically has a thickness around 75 nm, is then usually formed over the oxide layer on the n-type surface of the device to act as an antireflection coating. The anodised dielectric layer 104 is then formed using an anodisation technique. Metal contacts 112 to the device can be formed on the n-type surface using either a chemical etching process or a laser structuring process followed by metal plating or screen printing of metal pastes. Electrical contact can then be enabled to the p-type surface of the device by forming openings 114 in the anodised layer 104 and alloying a layer of metal 116, such as aluminium, through these openings to form Ohmic contacts to the device. The openings may be formed using a patterning process that exploits the porous nature of the anodised layer 104. The anodised dielectric layer 104 therefore simultaneously passivates the device and enables fine-scale metal contacts to be formed to a surface of the device. The passivation provided by the anodised layer 104 is due in part to the electrical charge stored in the layer and in part to the passivation of traps at the silicon/silicon dioxide interface. The thin oxide layer 108 formed on the p-type surface ensures the quality of passivation and can provide a barrier to prevent anodisation extending in the semiconductor device. Thick silicon oxide layers 108 can also be used. However, to decrease the overall resistance during the anodisation process, the thickness of the oxide layer 108 is typically limited to 30 nm.

FIG. 1(*b*) shows a variation 150 of the solar cell 100 of FIG. 1(*a*), where a heavily-doped p-type layer 118 is formed on the p-type surface of the p-type silicon wafer 102. This layer can be formed using a solid state diffusion process or ion implantation and is typically very thin (i.e., less than 1 micrometer). Due to the high concentration of p-type atoms at the surface, a metal layer 116, for example a nickel layer, can be directly plated through the openings of the anodised layer 104. Alternatively, a metal layer 116, such as aluminium, can be deposited by thermal evaporation, e-beam evaporation or sputtering onto the surface of the anodised layer 104 to form p-type metal contacts to the device. The advantage of the structure 150 of FIG. 1(*b*) is that the fabrication process does not require a high temperature alloying step to form the Ohmic metal contacts through the anodised layer 104. The heavily-doped p-type layer 118 also provides a reduction of the lateral series resistance associated with current being collected in the small area metal contacts which are made through the anodised layer 104.

Devices similar to the solar cells represented in FIG. 1 can be realised using an n-type wafer with a diffused p-type emitter. An anodised layer can be used in these devices in a similar manner as is illustrated in FIG. 1.

Figure 2:
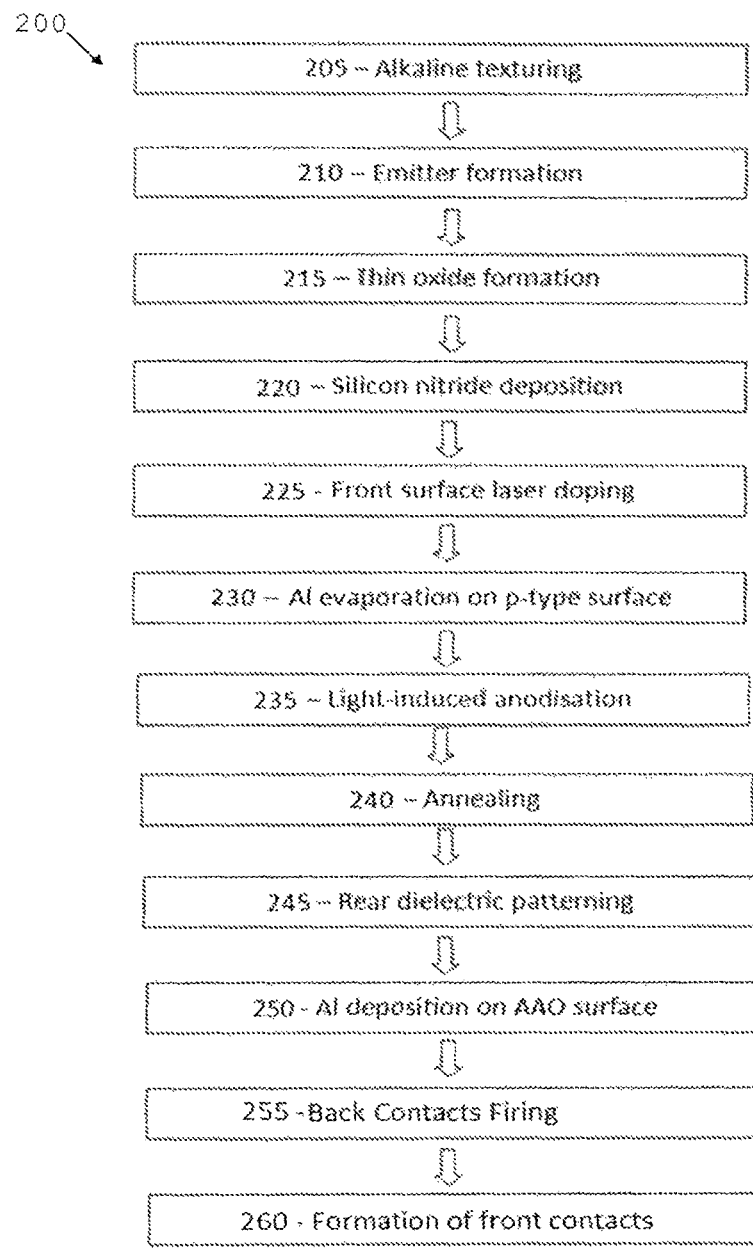
FIG. 2 is a flow chart of a solar cell fabrication process that includes the formation of an anodised layer on the rear surface of the device.

Referring now to FIG. 2, there is shown a flow chart 200 with the fabrication process steps of the solar cell 100 of FIG. 1(*a*). An analogous process can be used to fabricate the solar cell 150 of FIG. 1(*b*). In step 205, p-type monocrystalline silicon wafers are textured, preferably using an alkaline texturing process, to reduce the reflection from the front surface. A phosphorus-doped emitter 106 is then formed in step 210.

After the emitter formation, the phosphosilicate glass is removed and the rear surface is etched to remove any residual phosphorus and isolate the emitter regions. A thin silicon dioxide layer 108 is formed on both surfaces of the wafer in a thermal oxidation step, 215. In step 220, a dielectric layer, such as silicon nitride 110, is formed using plasma-enhanced chemical vapour deposition (PECVD) on the front surface of the device. Openings are then formed in the front surface in step 225 providing electrical access to the n-type surface of the solar cell. The openings can be formed by chemical etching or laser doping. Typically the openings are linear such that they can be subsequently metallised by metal plating to form n-type electrical contacts to the solar cell.

A layer of metal, usually aluminium, with a thickness between 25 nm and 800 nm, such as with a thickness between 300 nm to 500 nm is formed over the rear thin oxide 108 on the p-type surface of the device in step 230. This layer can be formed by thermal evaporation, e-beam evaporation or sputtering. The aluminium layer is optionally sintered at 350-400° C. for about 15 minutes to increase its grain size and improve uniformity of the pores.

In step 235 the metal layer formed on the solar cell is anodised using an anodisation technique such as the method disclosed herein. The effective minority carrier lifetime can be measured for the solar cell after step 235. The lifetime value may not have increased over the value measured before the aluminium evaporation, step 230. This can be due to electrical damage, or defects, caused by the current tunneling through the thin oxide 108 of the solar cell. A subsequent annealing step 240 after anodisation is performed to passivate defects that may have been introduced during the anodisation step 235 and serves to increase the effective minority carrier lifetime of the solar cell. The improved lifetime is due to hydrogen-containing species within the anodised layer 104, such as retained water, releasing hydrogen into the silicon interface where it can passivate trap states which would otherwise result in carrier recombination. The parameters of the annealing step are related to the properties of the anodised layer and consequentially to the properties of the electrolytic solution and the magnitude of the voltage/current used during the anodisation process. Typically annealing temperatures between 300° C. and 500° C. provide effective passivation of the solar cell.

The rear anodised dielectric layer 104 is patterned in a further step, 245. The patterning can be realised using chemical etching techniques or by using an inkjet printing apparatus. A metal layer, such as aluminium, is deposited in step 250 on the rear surface of the cell on top of the patterned anodised layer 104 and alloyed in a high temperature firing process in step 255 to form localised heavily-doped regions that enable Ohmic contact to the solar cell and reduce the recombination at the contact regions by forming a high-low junction below the metal. Alternatively a low temperature annealing process can be performed, at temperatures between 300° C. and 500° C., to facilitate formation of Ohmic contacts. Finally, metal contacts 112 are formed on the front surface, in step 260. Alternatively metal paste can be screen printed over the patterned openings.

Figure 3:
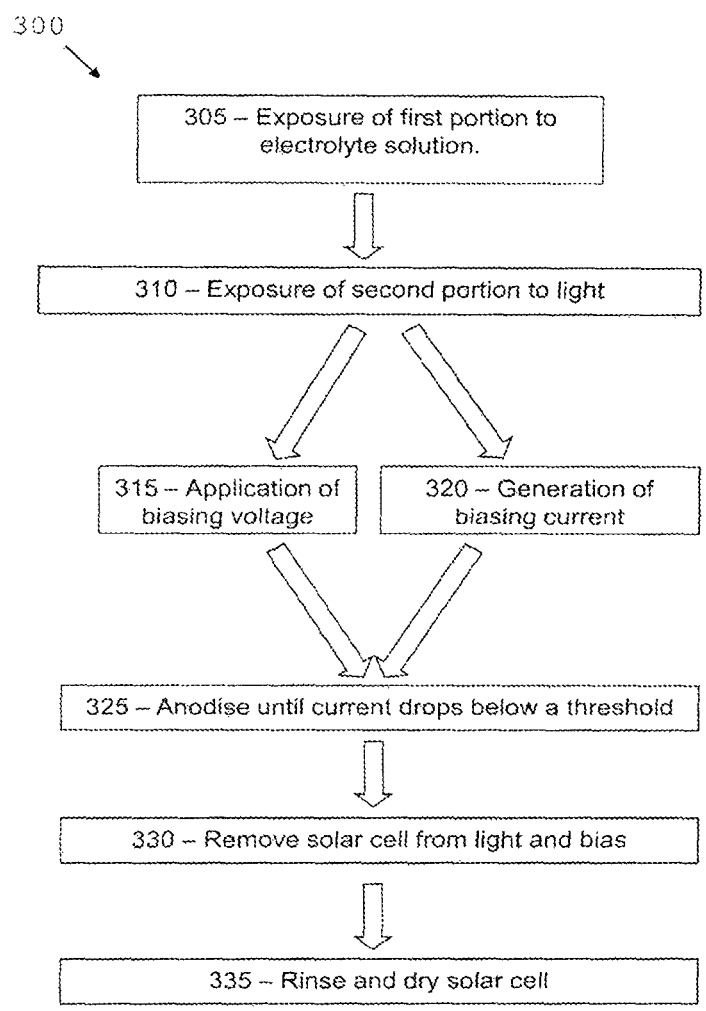
FIG. 3 is a flow chart of a light-induced anodisation process.

Referring now to FIG. 3, there is shown a flow chart 300 illustrating steps to anodise the surface of a semiconductor device comprising a p-n junction according to an embodiment of the present invention. In relation to the fabrication of a silicon solar cell, as in FIG. 2, the flow chart 300 corresponds to the step numbered as 235. The method 300 of FIG. 3 may be advantageously used to form a dielectric layer on a surface of a solar cell.

In step 305 the surface portion which needs to be anodised is exposed to an electrolytic solution containing a source of oxygen. The oxygen source can be water or provided by an oxidising electrolyte such as sulphuric acid, nitric acid, phosphoric acid or oxalic acid. To realise porous aluminium oxide layers, electrolytic solutions such as sulphuric acid, phosphoric acid and chromic acid may be advantageously used. Different electrolytic solutions will result in different pore sizes and spacing between pores.

A second portion of the semiconductor device is exposed to suitable radiation, such as visible light. The radiation is absorbed by the semiconductor resulting in the generation of electron and hole charge carriers which are separated by the p-n junction to generate a radiation-induced current. The radiation-induced current is proportional to the intensity of the incident electromagnetic radiation and therefore higher anodisation currents can be achieved using stronger illumination intensities. In some embodiments, the light intensity incident on the front surface of the solar cell is greater than the 0.005 W/cm$^2$ to sustain the anodisation reaction, and more preferably between 0.01 and 0.1 W/cm$^2$. Although higher light intensities can result in larger currents, they can cause undesired variations of the temperature of the electrolytic solution.

The radiation-induced current flows in the electrochemical circuit constituted by the semiconductor device, the electrolytic solution, a cathode exposed to the electrolytic solution, and an anode which is in electrical contact with a surface portion of the device. In this case, the radiation-induced current and the oxygen contained in the electrolytic solution act together to anodise a surface portion of the semiconductor device.

However, often the radiation-induced current of the semiconductor device is insufficient to drive a sustained anodisation reaction on the surface of the semiconductor device as the current must be able to tunnel through the forming dielectric layer which presents a significant resistance to the current flow in the circuit. The overall resistance of the electrochemical circuit, constituted by the surface being anodised, the wiring, the electrolytic solution and the interface between the solution and the surface being anodised, may be too high to allow a sustained current. To overcome this problem, in some embodiments of the invention, a bias voltage is applied to the device to offset the circuit resistance, in step 315. In these embodiments the device is illuminated whilst a biasing voltage is applied to the illuminated surface. The biasing voltage can be applied to a surface portion of the semiconductor device using an electrode element connected to the voltage source which acts as an anode for the electrochemical circuit. In an alternative embodiment the voltage source is replaced by a current generator, step 320.

An anodisation current can be observed in the electrochemical circuit as anodisation proceeds in step 325. When this current drops below a certain threshold (typically less than 1 mA), the anodisation process is considered complete. The semiconductor device is removed from the anodisation apparatus in step 330 and then rinsed in deionised water to remove traces of electrolyte and dried in step 335.

Figure 4:
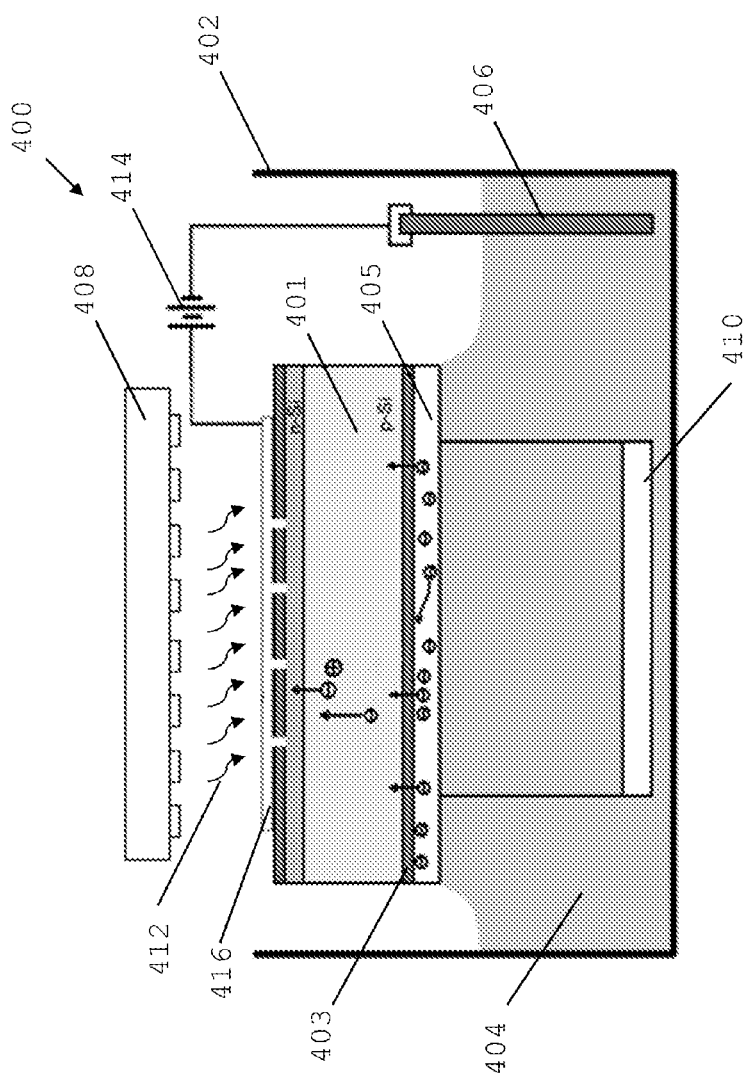
FIGS. 4 to 7 are schematic representations of light-induced anodisation apparatuses in accordance with embodiments of the present invention.

Referring now to FIG. 4, there is shown a simplified schematic of a light-induced anodisation apparatus 400 in accordance with an embodiment of the present invention. In the example of FIG. 4, the device is a single junction silicon solar cell 401 that comprises a p-type silicon wafer. The p-type surface of the solar cell 401 comprises a thin oxide 403 and a metallic layer 405, such as an aluminium layer, and is exposed to the electrolytic solution. The apparatus comprises a container 402 for containing an electrolytic solution 404, a cathode element 406, a light source 408 arranged to illuminate the top surface of the solar cell and a support 410 which supports the solar cell such to expose the bottom surface of the cell to the electrolytic solution and the top surface to the incoming light 412.

In the embodiment of FIG. 4 the system has a voltage source 414 which applies a biasing voltage between an electrode 416 on the top surface of the solar cell and the cathode element 406. The electrode 416 is a transparent or semi-transparent electrode which allows the incoming light 412 to reach the active area of the solar cell 401 to induce a current in the device. The cathode element 406 is at least partially exposed to the electrolytic solution 404. The light-induced current flows in the electrochemical circuit comprising the solar cell 401, the anode 416, the voltage source 414, the cathode element 406 and the electrolytic solution 404, allowing the anodisation of the surface material at the bottom surface (rear) of the solar cell 401.

The electrode 416 may comprise a transparent conductive polymer layer formed on glass, or alternatively a conductive film deposited on a transparent substrate such as, an indium tin oxide (ITO) coated glass or plastic and fluorine doped tin oxide (FTO) coated glass or plastic.

The chemical solution 404 is typically an electrolytic solution containing an oxygen source. The chemical solution 404 may for example comprise an electrolyte with 0.5 M sulphuric acid. However, concentrations in the range of 0.2 M and 2.0 M can also be used. Sulphuric acid is known to result in fast anodisation compared to other electrolytes (i.e., phosphoric acid and oxalic acid).

Figure 5:
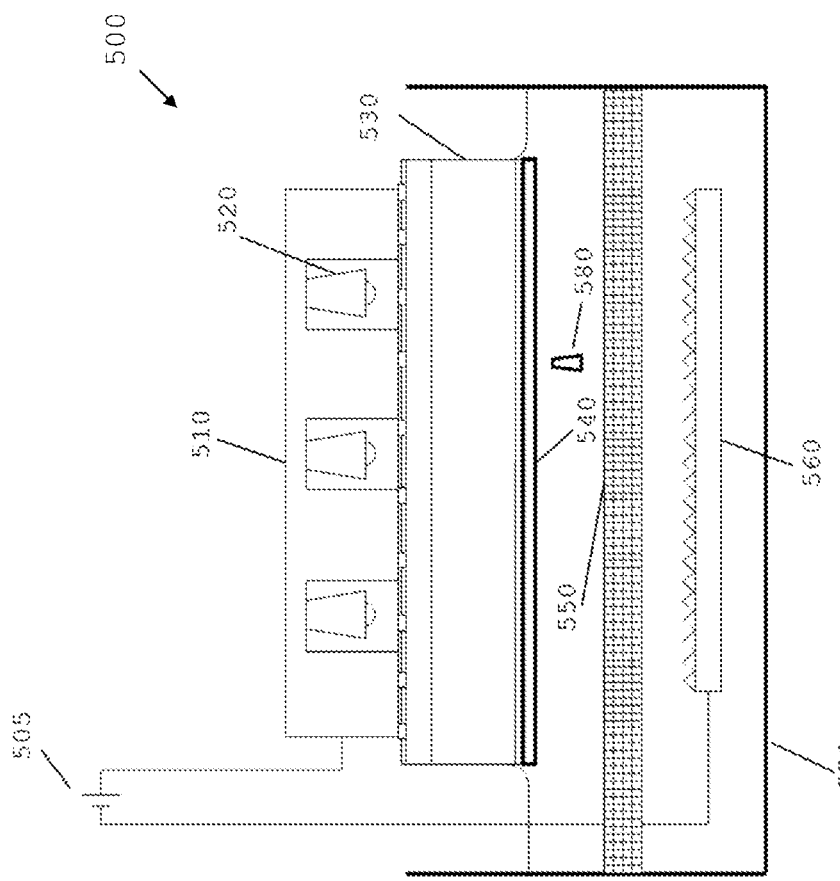

Referring now to FIG. 5, there is shown a simplified schematic of a light-induced anodisation apparatus 500 in accordance with another embodiment of the present invention. In the example of FIG. 5, the device is a silicon wafer 530 comprising a p-n junction. The wafer 530 is held by conductive vacuum wafer holder 510 with the s-type surface facing up. Light sources 520, built into the vacuum wafer holder 510, provide illumination during the anodisation process. The p-type surface 540 of the wafer may comprise a metallic layer, such as an aluminium layer, and is exposed to the electrolytic solution. An underlying nozzle 580 facilitates the initial contact with the electrolytic solution by 'wetting' the surface 540. A biasing voltage 505 is applied across the top side of the wafer and the cathode element 560 in the p-n junction reverse bias direction but without driving the junction in the reverse bias region. The top surface of the wafer is electrically connected to the anode of the voltage source 505 by the conductive vacuum holder 510. A filter 550 is placed between the wafer 530 and the cathode element 560 to minimise the impact of bubbles from evolved hydrogen on the cathode during anodisation.

Figure 6:
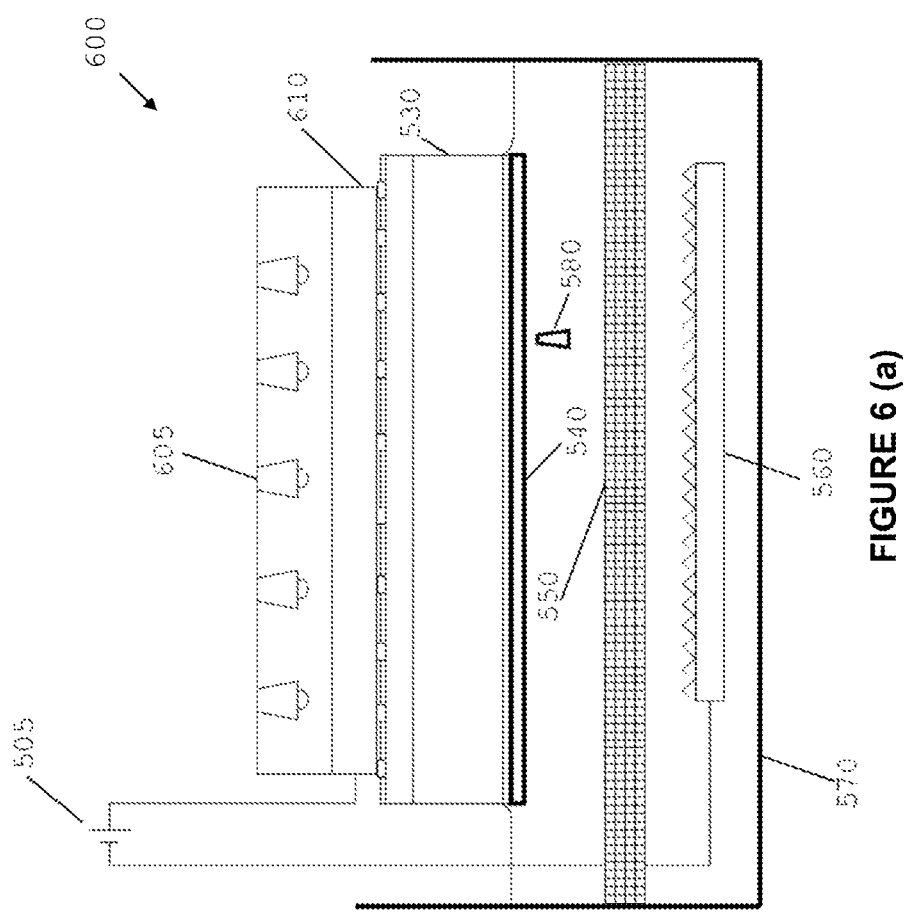
Figure 6B:
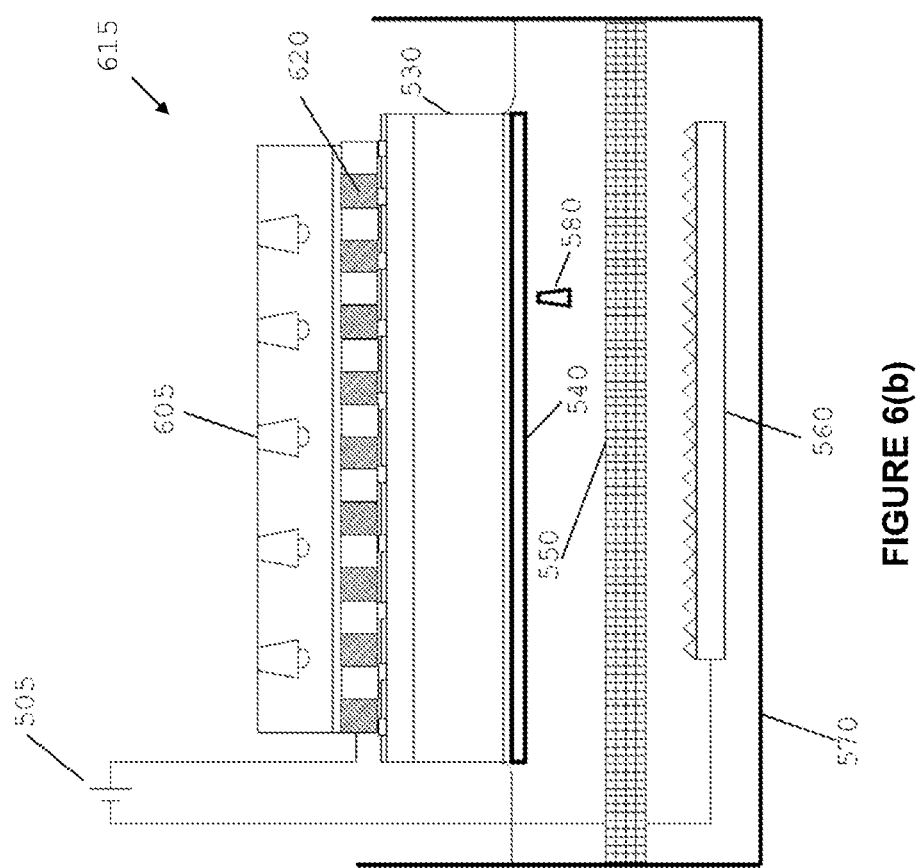

Referring now to FIG. 6(*a*), there is shown a variation 600 of the light-induced anodisation apparatus 500 of FIG. 5. In this embodiment the wafer 530 comprises a transparent electrode 610. An array of light sources 605 is placed above the transparent electrode 610 to provide illumination.

Referring now to FIG. 6(*b*), there is shown a further variation 615 of the light-induced anodisation apparatus. In the embodiment of FIG. 6(*b*) the electrode element 620 is a patterned flexible electrode and does not require being transparent. Illumination provided by the light sources array 605 is conveyed through the patterned electrode 620 to the top active surface of the wafer 530. The patterned flexible electrode may comprise a conductive gel formed on rubber, a conductive rubber or a graphite mat.

Figure 7A:
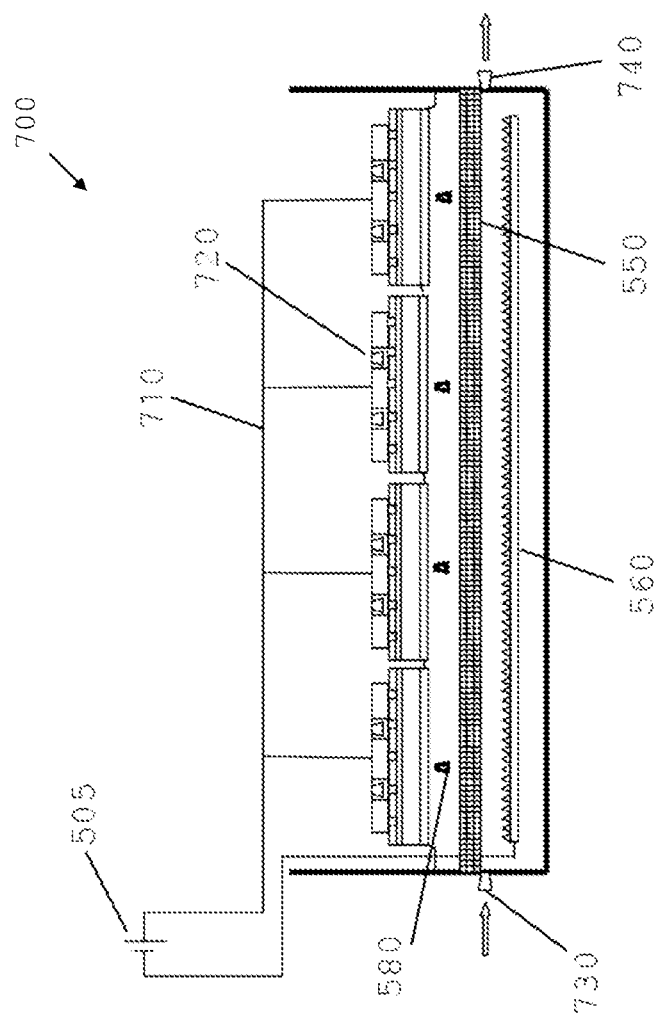
Figure 7B:
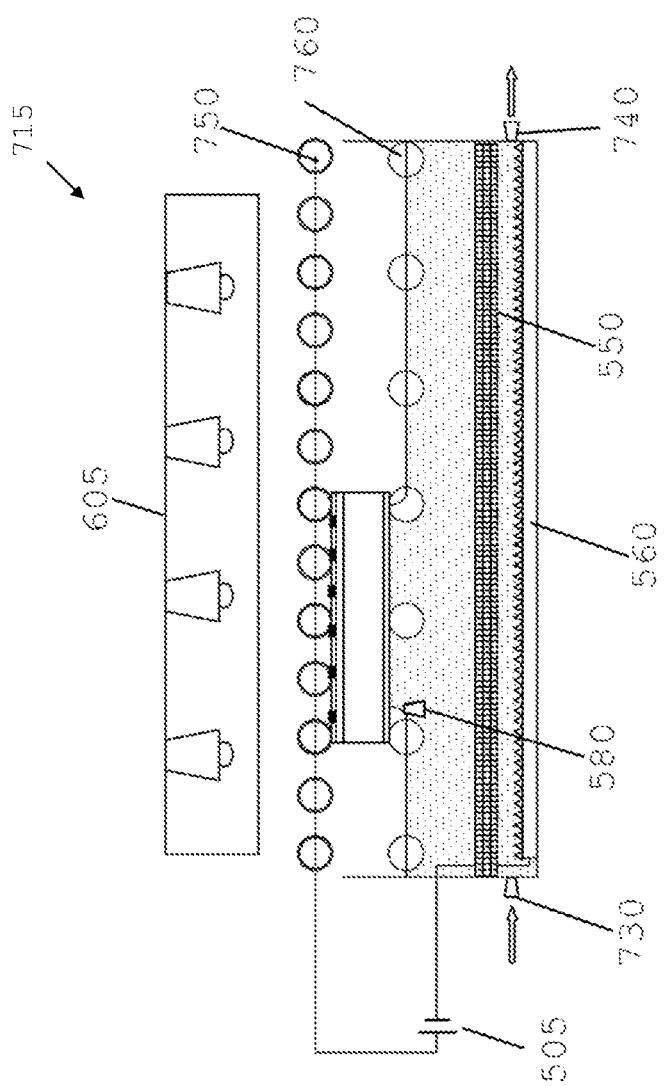
Figure 7C:
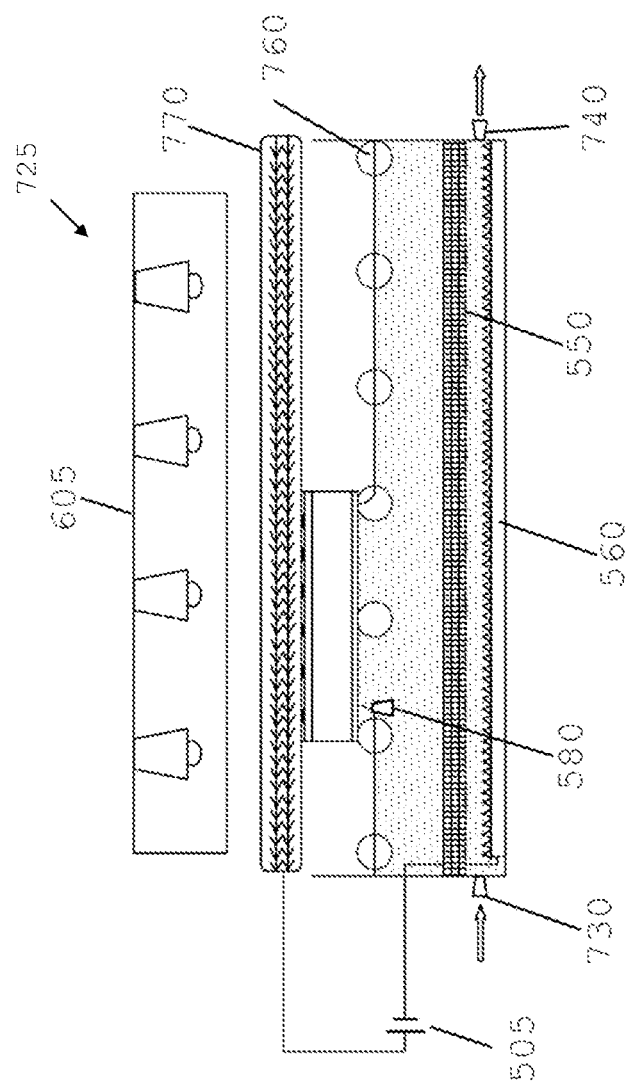

Referring now to FIG. 7(*a*), there is shown a schematic of an in-line light-induced anodisation apparatus 700 in accordance with another embodiment of the present invention. The apparatus consists of multiple vacuum wafer holders 720, nozzles 580 and a larger electrolytic solution container. Wafer holders 720 are connected in parallel to the voltage source 505 to ensure consistent voltage bias. The electrolytic solution concentration and temperature is maintained by circulating the electrolytic solution through an inlet 730 and an outlet 740 of the container.

Referring now to FIG. 7(*b*), there is shown a variation 715 of the apparatus of FIG. 7(*a*). The apparatus 715 consists of a set of conductive rollers 750 contacting the top side of solar cell whilst another set of non-conductive rollers 760 support wafers from the bottom side. An array of light sources 605 is above the conductive rollers 760 to provide illumination through the gaps between rollers. The moving rollers will guide the wafer which moves laterally through the electrolytic solution container while being anodised.

Referring now to FIG. 7(*c*), there is shown a variation 725 of the apparatus of FIG. 7(*b*) where the conductive rollers 750 are replaced by a conductive conveyer belt 770 which contacts the top side of solar cell. The use of a conveyer belt 770 allows continuous contact between the bias voltage source 505 and the top side of the solar cells.

In the embodiments of the radiation-induced anodisation apparatus disclosed herein, such as the examples illustrated in FIGS. 4 to 7(c), the temperature of the electrolytic solution is maintained at a constant value to ensure a consistent anodisation reaction and to control any electrolytic solution heating effects that may result from illumination. The temperature may be set at a value between 0° C. and 80° C. The anodisation reaction is faster at higher temperature and the electrical and morphological properties of the porous oxide are related to the anodisation temperature.

The method shown in FIG. 3 and the apparatus of FIGS. 4 to 7(c) can be used to anodise a surface layer of a semiconductor device. The physical properties of the anodised layer are related to the type of material being anodised, the type of electrolytic solution and the anodisation conditions. For example, a compact barrier oxide layer may be formed or a porous oxide layer may be formed depending on the solubility of the oxide in the electrolytic solution. Aluminium, for example, can form a porous oxide layer because aluminium oxide has significant solubility in the commonly-used electrolytes of sulphuric acid, phosphoric acid, oxalic acid, and mixtures thereof. Nevertheless, aluminium forms a barrier oxide layer if it is anodised in a solution such as boric acid wherein the aluminium oxide is less soluble. Porous anodic oxides can reach thicknesses of several micrometers. The pores in fact enable a sustained oxidation reaction to occur providing the electrolytic solution with access to the unreacted metal or semiconductor.

More generally, the physical properties of the anodised layer can be modified by changing the chemical properties of the electrolytic solution, the intensity of the radiation and the biasing voltage or current in the circuit. For example, in the anodisation process of aluminium, a sulphuric acid electrolyte can be used to obtain pore sizes between 12 nm and 100 nm, with 12 nm pores being typical when a 0.5 M sulphuric acid electrolyte is used. Alternatively, phosphoric acid and oxalic acid may be used to obtain larger pore sizes, with pore diameters between 30 nm and 235 nm being able to be achieved using phosphoric acid.

Advantageous embodiments of the present invention can be used to anodise the rear surface of a solar cell, or a layer of material formed on a surface of a solar cell, such as a layer of aluminium or titanium on the p-type surface of a silicon solar cell. FIG. 4 shows an embodiment of a light-induced anodisation apparatus where the rear surface of a silicon solar cell is anodised. The p-type surface of the silicon solar cell 401 is in contact with the electrolyte 404, whilst the n-type surface is contacted by the electrode element 416 and illuminated by radiation 412 generated by the biasing light source 408. The oxide layer forms at the silicon/electrolyte interface and grows inwards towards the silicon substrate. The anodisation process is sustained by the supply of electrons which tunnel through the formed oxide at the surface. As the oxide grows thicker, the amount of electrons which can tunnel through it decreases. The anodisation reaction proceeds until the current ceases to flow or reduces below a threshold. The thickness of the anodised layer may be varied by modifying the voltage bias. In fact, a higher bias, thus a stronger electric field, allows electrons to tunnel through thicker oxide layers.

The bias voltage is operated in a manner to avoid reverse biasing of the p-n junction to maintain uniform current flow through the surface being anodised. Reverse bias of the junction may cause breakdown which may lead to non-uniform currents. Reduced sources of recombination in the solar cell increase the radiation-induced potential of the cell and may increase the thickness of the formed oxide layer.

Suitable electrolytic solutions for the formation of silicon oxide layers are nitric acid and sulphuric acid, with acid concentrations of 0.1 M to 5 M. These provide silicon oxide layers with high electrical quality.

The properties of the surface portion exposed to the electrolytic solution also affect the anodisation process. For example, a hydrophobic surface is difficult to 'wet' uniformly in the electrolytic solution. Non-uniform anodisation may occur in localised regions where the surface is not as hydrophobic. Uniform anodisation requires a clean and hydrophobic surface that aids 'uniform wetting' by the electrolytic solution, assuring effective surface passivation. In some instances, a clean and hydrophobic surface is formed by removing the native oxide in a 2.5% (w/v) hydrofluoric acid solution and rinsing in deionised water for at least 10 minutes to grow another clean thin native oxide. The native oxide is densified and incorporated into the anodic oxide that forms during the anodisation process. In other instances, for example radiation-induced anodisation of silicon, the anodisation process may be started on the hydrophobic surface of a silicon substrate directly after hydrofluoric acid solution and a seed oxide layer is not essential.

The electronic passivation of the formed anodised layer may be improved by performing an annealing step (see FIG. 2, step 240). For example, anodised silicon dioxide layers can be annealed in an oxygen ambient at 400° C. for at least 15 minutes and then in forming gas ($Ar/H_2$) at the same temperature for additional, at least, 15 minutes. The oxygen anneal facilitates the completion of the oxide formation. The forming gas provides a source of hydrogen that can penetrate the anodic oxide and passivate defect states that may have formed at the silicon interface with the formed silicon dioxide layer. Unlike the anodisation process of a metal layer, such as aluminium, where water vapour and other hydrogen-containing species can become trapped within the porous structure and provide a source of hydrogen. Barrier silicon dioxide layers have limited ability to store hydrogen sources from the electrolytic solution and consequently are more dependent on external sources of hydrogen such as forming gas for passivation of the interfacial defect states.

Figure 8:
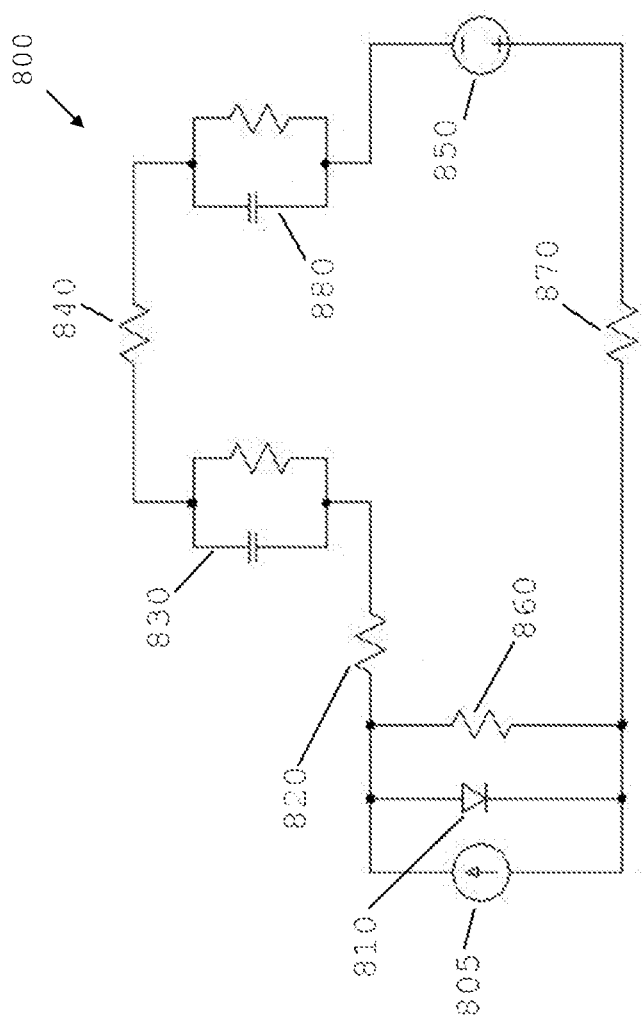
FIG. 8 is an equivalent circuit diagram of a light-induced anodisation process.

In order to further understand the mechanisms which regulate the light-induced anodisation process, the apparatus illustrated in FIG. 4 can be represented in terms of an equivalent electrochemical circuit 800 as shown in FIG. 8. The solar cell can be represented as a single junction device, which comprises a current generator 805 representing the light-induced current, the p-n junction 810, the shunt resistance 860 and a series resistance 820. A capacitor in parallel with a resistor 830 represents the electrochemical surface potential between the material to be anodised and the electrolytic solution. The Ohmic resistance in the electrochemical circuit is represented by a resistor 840. This resistance includes contributions from the electrolytic solution and the wires, whilst another resistor 870 represents the contact resistance between the electrode element and the electrically contacted surface of the solar cell. The electrochemical surface potential between the cathode and the electrolytic solution is represented by a capacitor in parallel with a resistor 880.

The biasing voltage 850 is applied across the electrode element and the cathode in a polarity such as to reverse bias the p-n junction 810 and thus effectively offset the resistance of the two resistors 840, 870 in the circuit. if resistance is high then the load experienced by the solar cell will exceed the open circuit voltage and there will be no light-induced current, thus no anodisation will occur. To give a term of comparison, the resistances associated with the anodisation electrochemical circuit are much larger, for example, than the resistances of a metal plating electrochemical circuit. This is due to the tunneling current through the dielectric layer. In one embodiment a thin oxide layer 108 is realised on the surface of the solar cell to prevent damage of the silicon and provide a barrier layer for the aluminium oxide.

In the embodiments represented in FIGS. 4 to 7, the light-induced current flows through the solar cell towards the p-type surface in a direction that is transversal to the surface being anodised. This is substantially different to other anodising systems where current extends over the surface exposed to the electrolytic solution from a contact point or region of an anode. The fact that the current is uniformly delivered to the entire surface to be anodised means that very uniform oxides can be formed.

The bias voltage should be selected such that the illuminated current-voltage curve of the device operates closer to the short circuit current position to maximise the light-induced current and avoid reverse bias. It is important not to reverse-bias the device being anodised to avoid non-uniform current flow. For example, if laser-doped openings are being used to enable the bias voltage to be applied to one side of the device and the device is forced into reverse bias, the regions of the junction may enter electrical breakdown at different voltage levels and a non-uniform current may flow through the device. In severe cases of reverse-biasing a solar cell's operating voltage may be reduced.

The electrolytic solution for the anodisation process does not require metal ions, thus the absorbance of the incident light by the solution is negligible, in contrast with light-induced plating processes. Consequently, a wide range of light sources can be used in a light-induced anodisation apparatus. In one specific arrangement, compact fluorescent light sources are used. However, alternative variations can use other light sources such as high-power LEDs, neon light sources or halogen light sources.

Figure 9:
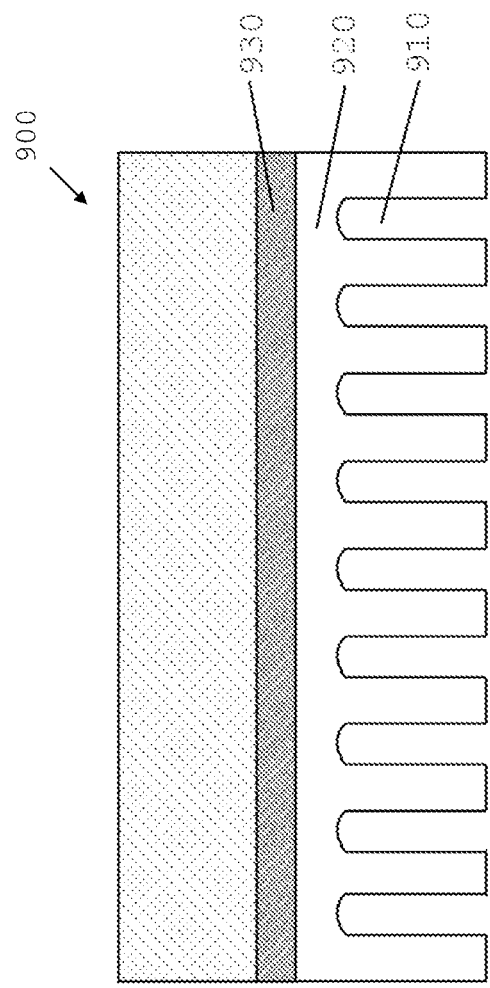
FIG. 9 is a schematic illustration of a close-up cross-sectional view of an anodic aluminium oxide layer.

Referring now to FIG. 9, there is shown a simplified diagram of a portion 900 of a device comprising a porous anodised aluminium oxide layer formed over an interfacial thin oxide layer 930 by anodising in an acid electrolytic solution in accordance with an embodiment of the present invention. During the anodisation process small pores are initiated at the surface and grow inwards as the oxidation process attains equilibrium between dissolution and formation of the aluminium oxide. The pores 910 become transversally oriented with a barrier layer of aluminium oxide 920. The thickness of the aluminium oxide 920 is determined principally by the anodisation voltage, which is related to the self-bias of the p-n junction in the device being anodised (light-induced voltage) and the applied bias voltage. Whilst unreacted aluminium remains and the current can tunnel through the barrier layer 920 the anodisation process continues. The result of this process is a porous layer of anodised aluminium with an inner barrier layer of compact aluminium oxide. In the method described herein no regions of unreacted aluminium remain when the anodisation current drops below a certain threshold which indicates the end of the anodisation process. Is some instances the threshold may be lower than the accuracy of the current-measuring instrument used to monitor the anodisation current. Furthermore, the light-induced anodisation process is not sensitive to the morphology of the surface being anodised and forms a uniform layer irrespective of whether the underlying surface of the semiconductor device is textured, planarised or polished.

In some embodiments, the light-induced anodisation method of the present invention is used to form barrier layer oxides. For example, layers of metals including, but not limited to, aluminium can be anodised in electrolytic solutions in which the formed oxide has a low solubility. The thickness of the dense oxide layer is limited by the voltage insisting on the anodised surface. Layers of an active device, for example a silicon layer of a silicon solar cell, may also be anodised to form compact barrier thin silicon dioxide layers. These thin oxide layers can contribute to surface passivation and also provide protection to potential-induced degradation. The thin oxides layers can be capped with other dielectric layers such as silicon nitride and form part of an antireflection coating of the solar cell.

After the light-induced anodisation process and successive annealing step, the anodised layer may be patterned to enable further processing, for example, the formation of metal contacts to one surface of a silicon solar cell. In an embodiment, the patterning step is realised using an inkjet printing apparatus which is arranged to selectively etch areas of the anodised layer. Well-resolved arrays of holes in the both the thin oxide and anodised layer, with a diameter as small as 20 micrometers to 40 micrometers can be formed by inkjet Printing 50% (w/w) $H_3PO_4$ onto the surface of an anodised aluminium layer. The printing process may be performed using a substrate temperature within the range of 30° C. to 75° C., such as around 60° C. The ambient relative humidity may be in the range of 20% to 80%. After the ink-jet printing is performed, wafers are transferred to a heated plate with a temperature in the range of 60° C. to 250° C. to accelerate the etching. The residue acid is then rinsed off in deionised water.

Figure 10:
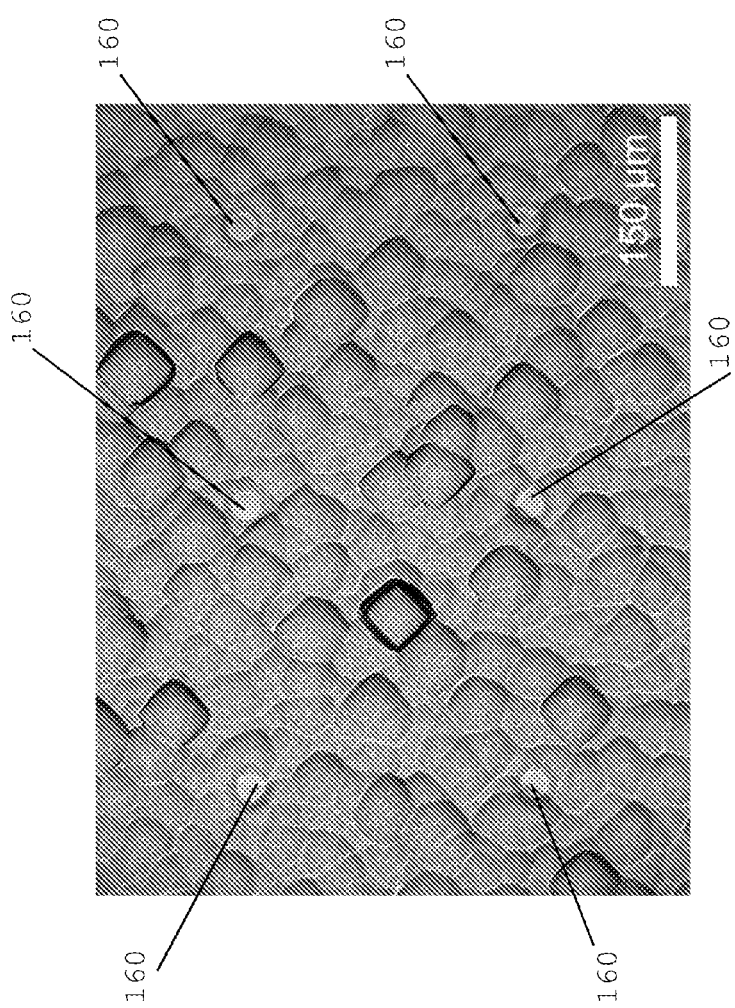
FIG. 10 shows a scanning electron microscope image of a patterned anodic aluminium oxide layer.
Figure 11A:
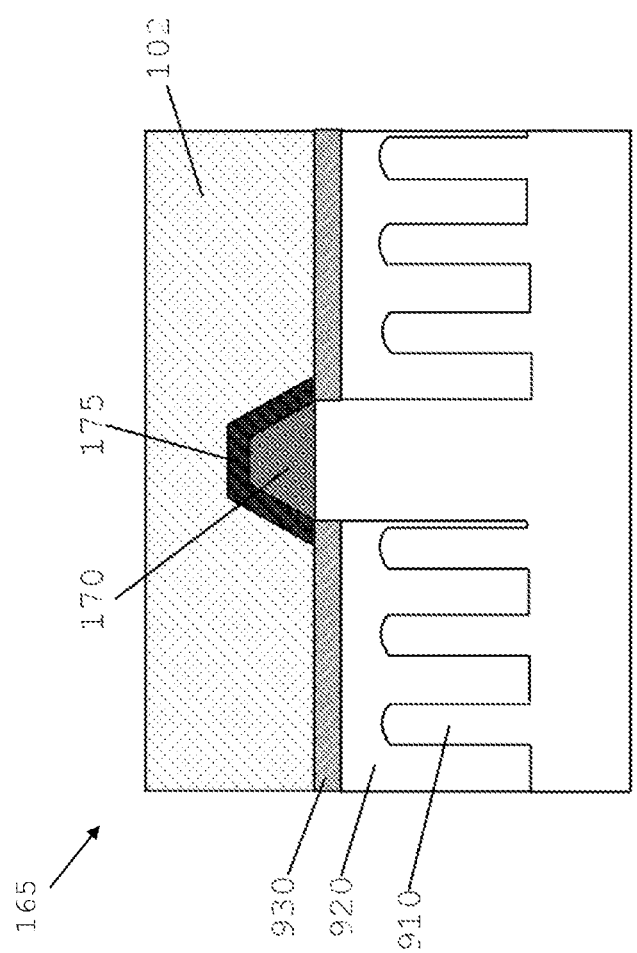
FIG. 11 shows a schematic illustration and a scanning electron microscope image of a cross-section of a p-type back contact.

Referring now to FIG. 10, there is shown a microscopic image of an array of etched holes 160 spaced 250 micrometers apart formed in an anodised aluminium layer with an initial thickness of 600 nm. The aluminium layer, deposited on a planar wafer, was anodised using a light-induced anodisation method in accordance with an embodiment of the present invention and it was patterned by inkjet patterning. When the anodised aluminium layer is used on the p-type rear surface of a silicon solar cell to form an effective contact to the solar cell, an additional capping layer of aluminium may be deposited on the anodised layer. The additional layer may be deposited by thermal evaporation, e-beam evaporation or sputtering onto the patterned anodised aluminium surface. This additional aluminium layer is then alloyed with silicon through the fine scale patterned holes 160 by annealing the solar cell at temperatures above the eutectic temperature of the aluminium-silicon binary alloying system. The result of this process is schematically represented in FIG. 11(a) and a cross sectional scanning electron microscope image is shown in FIG. 11(b).

Figure 11B:
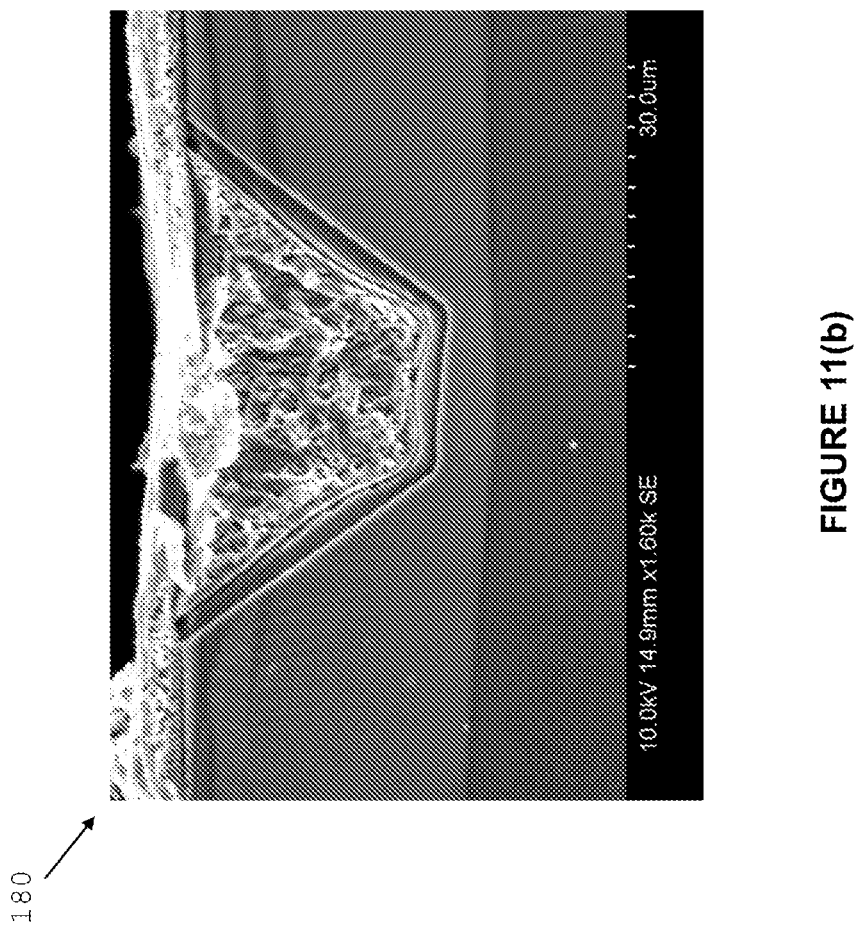

FIG. 11 (a) shows a portion 165 of a solar cell comprising an aluminium-doped silicon layer 175 at the interface of a p-type silicon substrate and the eutectic region 170. The local back surface electric field (BSF) created by the aluminium-doped p-type region 175 provides shielding of the minority carriers from the high surface recombination velocity area at the metal-silicon interface. FIG. 11(b) shows a cross sectional scanning electron microscope image 180 of a point contact and local BSF formed by the aluminium alloying step. The local BSF regions were exposed for imaging purposes by laser cleaving from the front (i.e., non-aluminium) surface and etched for 20 seconds in an CH3COOH:HNO3:HF (6:3:1) solution which etches heavily-doped p-type silicon at a faster rate than moderately-doped silicon.

Figure 12:
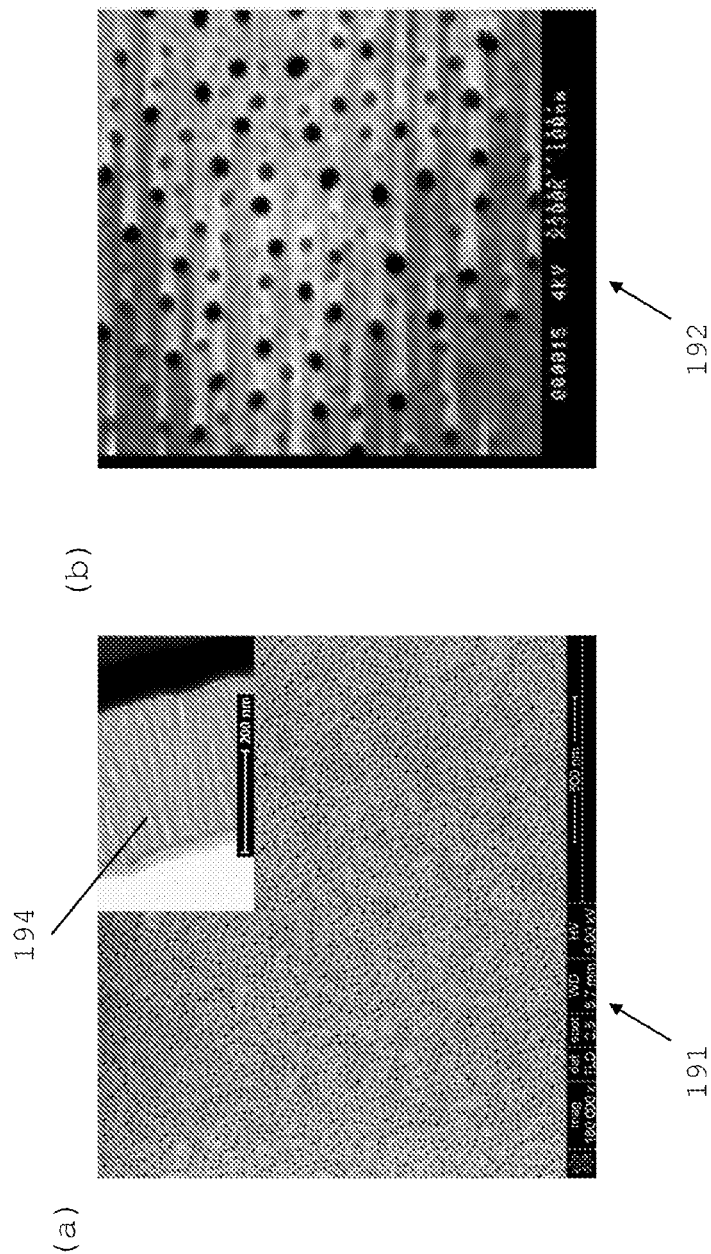
FIG. 12 shows a scanning electron microscope comparison between anodic aluminium oxide layers formed by radiation-induced anodisation and a clip-based anodisation.

Referring now to FIG. 12, there is shown a comparison of scanning electron microscope images of an aluminium layer 191 anodised using a light-induced anodisation method in accordance with an embodiment of the present invention and an aluminium layer 192 anodised using the clip-based anodisation common in the prior art. The cross sectional image 194 shows the porous structure of the light-induced anodised aluminium layer 191. Both surfaces show the porous structures, although small differences in pore spacing exists, the size of the pores formed through the use of the light-induced anodisation method is very similar to those formed using the clip-based method.

Figure 13:
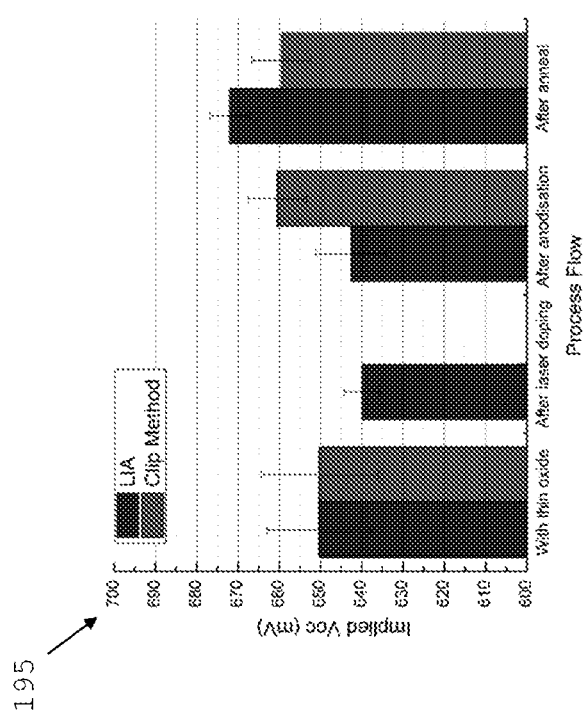
FIG. 13 shows a comparison of implied open circuit voltages of solar cells with surfaces electronically passivated by anodic aluminium oxide layers formed by radiation-induced anodisation and a clip-based anodisation.

Referring now to FIG. 13, there is shown a plot 195 of implied open circuit voltages (iVoc) of solar cell devices as a function of processing steps. The iVoc can be computed from photo-conductance measurements and is representative of the effective minority carrier lifetime of the device. The plot compares the iVoc values of solar cells with anodised layers formed using a light-induced anodisation method in accordance with an embodiment of the present invention (left columns—LTA) and the clip based method common in the prior art (right columns—CLIP). The iVoc were measured at each step of the fabrication process and compared. FIG. 13 highlights the variations of iVoc throughout the process, with the error bars showing the standard deviation of 5 samples. Solar cells in both groups started with comparable iVoc values, however the cells in the LIA group were affected by laser induced damage during the required laser doping step. After anodisation, an average increase of 10 mV in iVoc was observed in the CLIP group, while only marginal increase occurred in the LIA group. A significant improvement of the cells in the LIA group was observed after the annealing process. The iVoc of the LIA cells increased from 640 mV to an average of 670 mV, whilst the iVoc of the CLIP group increased only slightly in average. The anneal process effectively passivates the damage induced by the light induced anodisation process and increases the iVoc. On the contrary, the susceptive non-uniform and incomplete anodisation of the clip-based method introduces variations between wafers, which result in inconsistent results after heat treatment and poorer final passivation properties.

Any discussion of documents, acts, materials, devices, articles or the like which has been included in the present specification is not to be taken as an admission that any or all of these matters form part of the prior art base or were common general knowledge in the field relevant to the present invention as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The invention claimed is:

1. A method of anodising a surface of a semiconductor device comprising a p-n junction, the method comprising the steps of:
   exposing a first surface portion of the semiconductor device to an electrolytic solution that is suitable for anodising the first surface portion when an electrical current is directed through a region of the semiconductor device at the first surface portion; and
   exposing a second surface portion of the semiconductor device to electromagnetic radiation in a manner such that the electromagnetic radiation induces the electrical current and the first surface portion anodises;
   applying a biasing voltage to generate a biasing electrical current to supplement the electrical current that is induced by the electromagnetic radiation;
   wherein the first and the second surface portions are disposed at opposite sides of the semiconductor device and the second surface portion is not exposed to the electrolytic solution.

2. The method claim 1 further comprising the step of selecting a property of the electrolytic solution to influence a property of the first surface portion after anodising.

3. The method of claim 1 further comprising the step of patterning the first surface portion after anodising.

4. The method of claim 1 wherein the method is conducted such that the radiation-induced current flows transversally to the first surface portion of the semiconductor device.

5. The method of claim 1 wherein semiconductor device is a silicon solar cell.

6. The method of claim 1 wherein the semiconductor device comprises an electrode element that is at least semi-transparent to the electromagnetic radiation and wherein the biasing voltage is applied via the electrode element.

7. The method of claim 1 further comprising the step of selecting the biasing voltage to control a rate at which the first surface portion anodises.

8. The method of claim 1 wherein the semiconductor device comprises an electrode element that is at least semi-transparent to the electromagnetic radiation and is arranged in electrical contact with the second surface portion; and
   wherein the method further comprises the step of electrically interconnecting the electrode element with a cathode element positioned for contacting the electrolytic solution so that the induced current can flow through the electrical circuit comprising:
   the first and second surface portions;
   the electrode element;
   the cathode element; and
   the electrolytic solution
   to anodise the first surface portion.

9. The method of claim 1 further comprising the step of controlling a property of the electromagnetic radiation to control a rate at which the first surface portion anodises.

* * * * *